(12) United States Patent
Seo et al.

(10) Patent No.: US 11,732,344 B2
(45) Date of Patent: Aug. 22, 2023

(54) LATERAL-TYPE VACUUM DEPOSITION APPARATUS, AND SOURCE BLOCK AND SOURCE ASSEMBLY FOR THE SAME

(71) Applicant: LG Display Co., Ltd., Seoul (KR)

(72) Inventors: Ji-Man Seo, Goyang-si (KR); Hoyoung Jeong, Goyang-si (KR); Jaewook Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 480 days.

(21) Appl. No.: 16/596,558

(22) Filed: Oct. 8, 2019

(65) Prior Publication Data

US 2020/0115789 A1 Apr. 16, 2020

(30) Foreign Application Priority Data

Oct. 10, 2018 (KR) .......................... 10-2018-0120580

(51) Int. Cl.
*C23C 14/24* (2006.01)
*H10K 71/00* (2023.01)

(52) U.S. Cl.
CPC ............. *C23C 14/24* (2013.01); *H10K 71/00* (2023.02)

(58) Field of Classification Search
CPC . C23C 16/54; C23C 16/45551; C23C 16/545; C23C 14/24; C23C 14/243;
(Continued)

(56) References Cited

U.S. PATENT DOCUMENTS 6,649,436 B2 11/2003 Ghosh et al.
7,802,539 B2 * 9/2010 Bosch ..................... C04B 41/80
156/345.43

(Continued)

FOREIGN PATENT DOCUMENTS

CN 1438826 A * 8/2003 ............. C23C 14/12
CN 1438826 A 8/2003
(Continued)

OTHER PUBLICATIONS

Frankyso, Editor. "Organic Electronics: Materials, Processing, Devices and Applications." CRC Press, an imprint of Taylor & Francis Group. 2010. pp. 567. (Year: 2010).*

(Continued)

*Primary Examiner* — Rudy Zervigon
(74) *Attorney, Agent, or Firm* — Seed IP Law Group LLP (57) ABSTRACT

The present disclosure relates to a lateral-type vacuum deposition apparatus, and a source block and a source assembly for the same. Disclosed are a source block that may simplify a lateral-type vacuum deposition apparatus and a lateral-type vacuum deposition apparatus using the same. The source block has a predetermined shape. In the lateral-type vacuum deposition apparatus, the substrate and the source block may face away each other. Accordingly, the lateral-type vacuum deposition apparatus including the source block is free of a conduit for transferring a vaporized source to a nozzle, thereby simplifying a structure of the apparatus. In particular, the source block may have a visible light transmittance of at least about 10% and may exhibit excellent shape maintenance ability during a lateral-type vacuum deposition process.

24 Claims, 11 Drawing Sheets

(58) Field of Classification Search
CPC ....... C23C 14/26; C23C 14/12; C23C 14/246; H01L 21/6719; H01L 21/67196; H01L 21/67201; H01L 21/67173; H01L 21/67184; H01L 21/6776; H01L 21/67161; H01L 51/56; H01L 51/001

USPC ................ 118/723 VE, 726; 156/345.29

See application file for complete search history.

(56) References Cited

U.S. PATENT DOCUMENTS

| | | | |
|---|---|---|---|
| 9,899,635 B2 | 2/2018 | Bangert et al. | |
| 2001/0005553 A1* | 6/2001 | Witzman | C23C 14/562 118/723 VE |
| 2002/0030640 A1* | 3/2002 | Nomura | H01J 29/864 345/45 |
| 2002/0140347 A1* | 10/2002 | Weaver | H01L 51/0097 313/506 |
| 2003/0153109 A1* | 8/2003 | Ghosh | H01L 51/001 438/29 |
| 2004/0018305 A1* | 1/2004 | Pagano | H01L 21/67236 427/255.7 |
| 2004/0056244 A1* | 3/2004 | Marcus | C23C 14/12 257/40 |
| 2004/0062856 A1* | 4/2004 | Marcus | H01L 51/0002 427/66 |
| 2004/0144321 A1* | 7/2004 | Grace | C23C 14/243 118/726 |
| 2004/0149834 A1* | 8/2004 | Shimoda | H01L 51/0005 239/135 |
| 2005/0016461 A1* | 1/2005 | Klug | H01L 51/001 118/726 |
| 2005/0016463 A1* | 1/2005 | Hirano | C23C 14/28 118/726 |
| 2007/0022955 A1* | 2/2007 | Bender | C23C 14/26 118/726 |
| 2007/0092635 A1* | 4/2007 | Huh | C23C 14/12 427/64 |
| 2008/0115729 A1* | 5/2008 | Oda | C23C 14/26 118/726 |
| 2009/0017192 A1* | 1/2009 | Matsuura | C23C 14/042 427/66 |
| 2011/0275196 A1* | 11/2011 | Eser | C23C 14/243 118/727 |
| 2012/0031339 A1* | 2/2012 | Ono | C23C 14/24 118/724 |
| 2013/0120504 A1* | 5/2013 | Yanata | B41J 2/045 347/68 |
| 2014/0004641 A1* | 1/2014 | Sonoda | H01L 51/56 438/34 |
| 2014/0138655 A1* | 5/2014 | Sonoyama | C09D 11/52 257/40 |
| 2014/0186985 A1* | 7/2014 | Kakiuchi | C23C 14/562 438/46 |
| 2015/0221897 A1* | 8/2015 | Kako | B05B 12/084 438/14 |
| 2017/0081755 A1* | 3/2017 | Dieguez-Campo | H01J 29/864 345/45 |
| 2017/0244070 A1* | 8/2017 | Bangert | H01L 51/0097 313/506 |
| 2018/0187299 A1* | 7/2018 | Kawato | C23C 14/562 438/46 |
| 2018/0245206 A1* | 8/2018 | Bangert | H01L 21/67236 427/255.7 |

FOREIGN PATENT DOCUMENTS

| | | | | |
|---|---|---|---|---|
| CN | 102732836 A | * | 10/2012 | ....... H01L 21/67196 |
| CN | 102732836 A | | 10/2012 | |
| CN | 102808167 A | | 12/2012 | |
| CN | 105917019 A | * | 8/2016 | ....... H01L 21/67196 |
| CN | 105917019 A | | 8/2016 | |
| CN | 107151781 A | * | 9/2017 | .......... C23C 14/246 |
| CN | 107151781 A | | 9/2017 | |
| KR | 20040110718 A | | 12/2004 | |
| KR | 20170103071 A | * | 9/2017 | .......... C23C 14/246 |
| WO | WO-2017008838 A1 | * | 1/2017 | .......... C23C 14/246 |

OTHER PUBLICATIONS

"Chapter 1: Introduction." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 1-57. (Year: 2014).*

"Chapter 2: GF-OVJP Nozzle Design." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 58-75. (Year: 2014).*

"Chapter 3: Fabrication of OLEDs by GF-OVJP." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 76-92. (Year: 2014).*

"Chapter 4: Fabrication of OPVs by GF-OVJP." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 93-125. (Year: 2014).*

"Chapter 5: Fabrication of OTFTs by GF-OVJP." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 126-166. (Year: 2014).*

"Chapter 6: Chemical Vapor Jet Deposition of Parylene." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 167-194. (Year: 2014).*

"Chapter 7: Conclusions and Future Work." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 195-204. (Year: 2014).*

"Appendix A: Deposition Profile and Thickness Measurement." in Shaurjo Biswas. "Guard Flow-enhanced Organic Vapor Jet Printing of Molecular Materials in Air." PhD Dissertation. University of Michigan, Horace H. Rackham School of Graduate Studies. 2014. pp. 205-209. (Year: 2014).*

* cited by examiner

LATERAL-TYPE VACUUM DEPOSITION APPARATUS, AND SOURCE BLOCK AND SOURCE ASSEMBLY FOR THE SAME

CROSS-REFERENCE TO RELATED APPLICATIONS

This application claims the priority of Korean Patent Application No. 10-2018-0120580 filed on Oct. 10, 2018, in the Korean Intellectual Property Office, the disclosure of which is hereby incorporated by reference in its entirety.

BACKGROUND

Technical Field

The present disclosure relates to a vacuum deposition apparatus.

Description of the Related Art

As display technology is developed, a flat panel display device is widely used. The flat panel display device includes a liquid crystal display device, an electroluminescence display device, and the like. The liquid crystal display device requires a backlight unit as a separate light source block and has technical limitations in terms of brightness and contrast ratio. Therefore, interest in the electroluminescence display device is increasing which is relatively superior to the liquid crystal display device in terms of brightness and contrast ratio and realizes a self-light emission and thus is free of a separate light source block.

Further, interest in lighting devices using an electroluminescent device is growing in the industry.

The electroluminescent device generally has a stack of a hole injection layer (HIL), a hole transport layer (HTL), a light emitting layer (ETL), an electron transport layer (ETL) and an electron injection layer (EIL).

Each of the layers constituting the electroluminescence element is generally formed by a vacuum deposition scheme. The vacuum deposition scheme includes an upward-type scheme and a downward-type scheme. In the upward-type vacuum deposition scheme, a substrate is placed at a top of a vacuum deposition apparatus, while a source is disposed at a bottom of the vacuum deposition apparatus. To the contrary, in the downward-type vacuum deposition scheme, the substrate is placed at the bottom of the vacuum deposition apparatus while the source is placed at the top of the vacuum deposition apparatus.

BRIEF SUMMARY

Inventors of the present disclosure have studied and developed a lateral-type vacuum deposition apparatus for formation of the electroluminescent device.

The inventors of the present disclosure have studied a lateral-type vacuum deposition scheme. In the lateral-type vacuum deposition scheme, a substrate is placed at one lateral end within a vacuum deposition apparatus, while a source is placed at the other lateral end in the vacuum deposition apparatus. The inventors of the present disclosure have recognized that the lateral-type vacuum deposition scheme may facilitate a continuous deposition process. Further, the inventors of the present disclosure have recognized that the lateral-type vacuum deposition scheme may solve a substrate sagging problem occurring in the upward-type and downward-type vacuum deposition schemes. The inventors of the present disclosure have recognized that the lateral-type vacuum deposition scheme allows a transfer system to be lightweight.

The inventors of the present disclosure have often used a powder-type source for the lateral-type vacuum deposition apparatus. The powder type source is transported to a nozzle facing away the substrate through a conduit in a vaporized state, and then is sprayed from the nozzle to the substrate.

The inventors of the present disclosure have recognized that when the powder type source block is applied to the lateral-type vacuum deposition apparatus, there occur problems that the powder type source collapses; and the source material is deposited on an inner wall of the conduit in the vacuum deposition process, thus requiring frequently cleaning to remove the source block material deposited on the inner wall of the conduit. Further, the inventors of the present disclosure have recognized that as the cleaning process is frequently performed, corrosion of the conduit is problematic, thus requiring periodic replacement of the conduit.

The present disclosure provides a source block that may allow the lateral-type vacuum deposition apparatus to have a simple structure.

Further, the present disclosure provides a source assembly that includes the source block.

Furthermore, the present disclosure provides a lateral-type vacuum deposition apparatus, which includes the source block and thus is free of a conduit for transferring a vaporized source.

The advantages of the present disclosure are not limited to the above-mentioned advantages. Other advantages of the present disclosure, as not mentioned above, may be understood from the following descriptions and more clearly understood from the embodiments of the present disclosure. Further, it will be readily appreciated that the purposes and advantages of the present disclosure may be realized by features and combinations thereof as disclosed in the claims.

A source block for a lateral-type vacuum deposition apparatus according to the present disclosure is formed in a predetermined shape unlike the conventional powder type source. When applying the powder type source to the lateral-type vacuum deposition apparatus, a complex shaped conduit is required to transport the vaporized source to the nozzle. Since, as described above, the source is deposited on the inner wall of the conduit during the vacuum deposition, the periodic cleaning processes are required to prevent clogging of the conduit. Further, the frequent cleaning processes may cause the corrosion of the conduit and thus frequent replacements of the conduit may be required. However, in accordance with the present disclosure, since the source block formed in the predetermined shape may directly face away the substrate, the conduit for transferring the vaporized source to the nozzle may be omitted. The shape of the source block may vary. For example, the shape may be a rectangular parallelepiped block.

In this connection, in some embodiments, the source block has a visible light transmittance of about 10% or greater. The source block formed in the predetermined shape may include a crystallized source block or a compression-molded source block. Among them, the crystallized source block may be produced by melting and cooling of the powder source and may exhibit a higher visible light transmittance than that of the compression-molded source block. Further, the crystallized source block may have a higher density than that of the compression-molded source block and may exhibit high fracture strength. Thus, the crystallized source block may exhibit excellent shape maintenance ability of the source block in the lateral-type deposition process.

The source block may contain an organic material for a layer for the electroluminescence device. Each layer of the electroluminescence device may be made of an organic material, which may be deposited in a lateral-type vacuum deposition scheme. The powder type organic material for the layer of the electroluminescence device may be molded into a predetermined shape and may be used as a source for the lateral-type vacuum deposition apparatus.

The source assembly for the lateral-type vacuum deposition apparatus according to the present disclosure to achieve the purpose includes the source block having the predetermined shape as described above, heating chamber and a nozzle.

The source block is mounted in the heating chamber, which serves to heat and vaporize the source block. The nozzle serves to discharge the source vaporized by the heating chamber. In this connection, the heating chamber has both spaced sides and a bottom. The source block may be fitted into the heating chamber. Further, the nozzle may be joined to tops of the both sides of the heating chamber.

Further, at least one plate may be disposed between the source block and the nozzle. The at least one plate allows the source block and nozzle to be slightly spaced from each other. Further, the at least one plate has an opening defined therein. Thus, a supplied amount of the source block may be controlled by adjusting a size of the opening.

Further, a cooling plate or a thermal-insulating plate may be coupled to a back side of the heating chamber. The array of source assemblies may be placed in one chamber. When evaporation temperatures of source blocks included in the source assemblies are different from each other, mutual heat influences between the source blocks are to be minimized. Thus, when the cooling plate or thermal-insulating plate is coupled to the backside of the heating chamber of each source assembly, this may prevent unwanted heat transfer between adjacent source assemblies.

The lateral-type vacuum deposition apparatus according to the present disclosure to achieve the above purpose includes a vacuum chamber and a source assembly. A substrate is placed in one lateral end inside the vacuum chamber, while the source assembly is placed in the other lateral end in the vacuum chamber. As a result, a surface of the substrate on which the source block is to be deposited faces away the source assembly. The source assembly supplies the vaporized source to the substrate. In this connection, the source assembly includes the source block. As described above, the source block has been molded into the predetermined shape.

In one example, the plurality of the source assemblies are arranged in a first direction and are disposed in the other lateral end inside of the vacuum chamber. The vacuum chamber may accommodate therein substrate transfer means for transferring the substrate in first direction. This configuration may allow, for example, multiple layers of different organic materials to be continuously deposited on the substrate in a single chamber.

The source block for the lateral-type vacuum deposition apparatus according to the present disclosure may be a molded block having a predetermined shape. Thus, in the lateral-type vacuum deposition apparatus, the substrate and the source block may face away each other. Accordingly, the lateral-type vacuum deposition apparatus including the source block according to the present disclosure may be free of a conduit for transferring a vaporized source to the nozzle, thereby simplifying the structure of the apparatus. In particular, the source block for the lateral-type vacuum deposition apparatus according to the present disclosure may exhibit excellent shape maintenance ability during a lateral-type vacuum deposition process, while having a visible light transmittance of about 10% or greater.

In addition to the above effects, specific effects of the present disclosure are described below in conjunction with descriptions of specific details to implement the present disclosure.

DETAILED DESCRIPTION

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a source block, a source assembly for a lateral-type vacuum deposition apparatus, and the lateral-type vacuum deposition apparatus using the same according to some embodiments of the present disclosure will be described.

Figure 1:
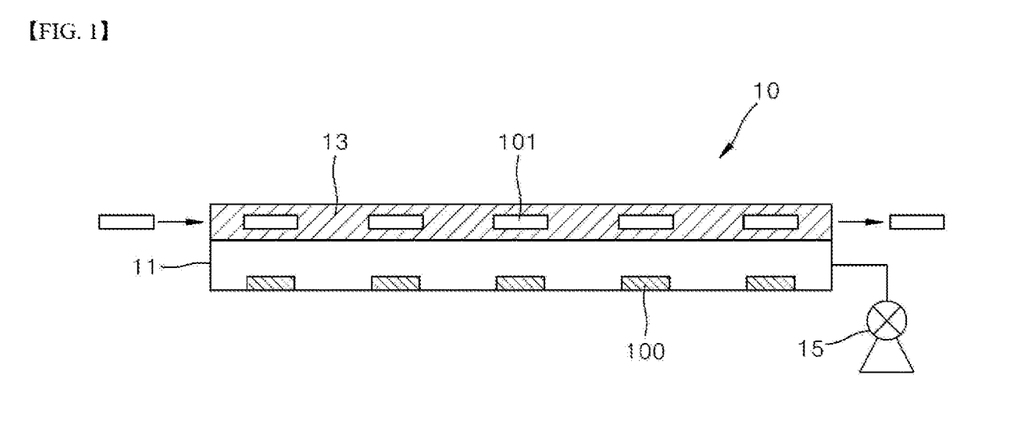
FIG. 1 is a top view schematically showing a lateral-type vacuum deposition apparatus according to the present disclosure.

FIG. 1 is a top view schematically showing a lateral-type vacuum deposition apparatus according to the present disclosure.

Referring to FIG. 1, a lateral-type vacuum deposition apparatus 10 according to the present disclosure includes a vacuum chamber including a chamber 11 and a pump 15, and a source assembly 100.

A substrate is placed at one lateral end of chamber 11. In a case where the substrate 101 has a rectangular shape with a long side and a short side, the long and short sides of the substrate 101 may define the bottom thereof.

In FIG. 1, in the array of source assemblies 100, the source assemblies are arranged horizontally in the chamber 11. The substrate 101 is transported in a direction from one lateral end to the other lateral end in chamber 11. The present disclosure is not limited thereto. For example, a single source assembly 100 may be placed in one chamber 11.

Substrate transfer means 13 may be disposed in the chamber 11 for transferring the substrate 101. The substrate transfer means 13 transports the substrate 101 in one direction while supporting the substrate 101. The substrate transfer means 13 may be embodied as, for example, a conveyor belt. Further, a slit (not shown) may be defined in a side wall of the chamber 11 to allow the substrate 101 transferred by the substrate transfer means 13 to move into the chamber 11 and to be discharged out of the chamber 11. Further, an additional vacuum chamber (not shown) may be provided outside the chamber 11 to maintain a vacuum state inside the chamber 11.

Figure 2:
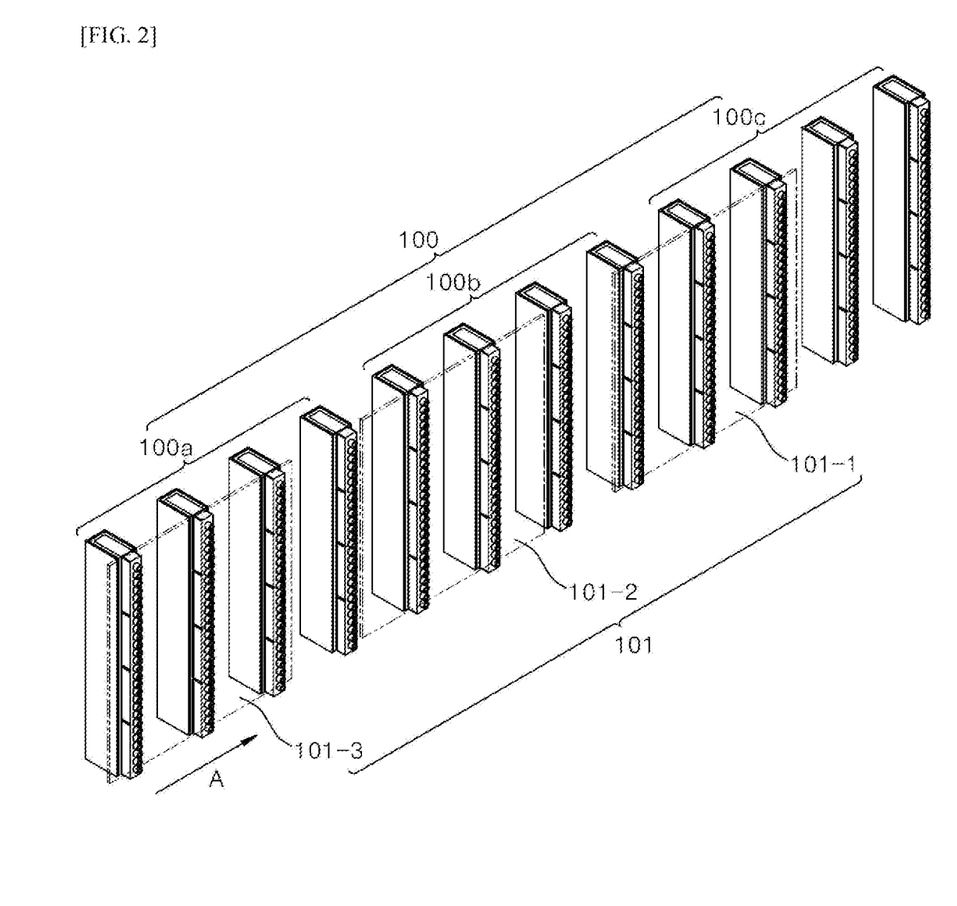
FIG. 2 shows an array of source assemblies used in a lateral-type vacuum deposition apparatus according to the present disclosure.

FIG. 2 shows the array of source assemblies used in the lateral-type vacuum deposition apparatus according to the present disclosure.

The source assembly 100 serves to supply the substrate 101 with the vaporized source. For this purpose, the source assembly 100 includes a source block, heating chamber for heating the source block, and a nozzle for supplying the heated source block to the substrate.

The source block may be an organic material for the layers of the electroluminescence device. Each layer of the electroluminescence device is formed of an organic material, which may be deposited in a lateral-type vacuum deposition scheme. The powder type organic material for each layer of the electroluminescence device may be molded into the predetermined shape, which may be used as a source block for the lateral-type vacuum deposition apparatus.

In FIG. 2, in the array of source assemblies 100a, 100b, and 100c, the source assemblies are arranged in an A direction. During the transportation of the substrates 101-1, 101-2 and 101-3 in the A direction, the substrates 101-1, 101-2 and 101-3 are subjected to the deposition. The source block 120 includes a source material for forming at least one of an electron transport layer, a light emission layer, a hole transport layer of the electroluminescence device. For example, an organic material source block used in the electron transport layer of the electroluminescence device is included in a source assembly 100a, an organic material source block used in the light emission layer of the electroluminescence device is included in a source assembly 100b, and an organic material source block used in the hole transport layer of the electroluminescence device is included in a source assembly 100c. Thus, the electron transporting layer, the light emitting layer and the hole transporting layer are sequentially formed on the substrate. That is, the electron transport layer is formed on a substrate 101-3 when source assembly 100a is used. After deposition of the electron transport layer, the substrate moves to the next step of the forming process. The previous substrate 101-3 is processed with source assembly 100b and the substrate 101-3 becomes the substrate 101-2 after forming the light emitting layer on the previous substrate 101-3. The light emitting layer is formed on the electron transport layer and the substrate 101-2 is moved to the next step of the forming process. The previous substrate 101-2 is processed with source assembly 100c and the substrate 101-2 becomes the substrate 101-1 after forming the hole transporting layer on the previous substrate 101-2. That is, the hole transporting layer is formed on the light emitting layer on the substrate 101-1.

Further, in FIG. 2, three source assemblies including the same organic material source block are grouped into one unit. However, the present disclosure is not limited thereto.

In other embodiments, a single source assembly may act as one unit. In another example, two or four source assemblies including the same organic material source block may be grouped into one unit. That is, various numbers of source assemblies (e.g., at least one or more source assemblies) may be grouped to form a specific source layer.

Figure 3:
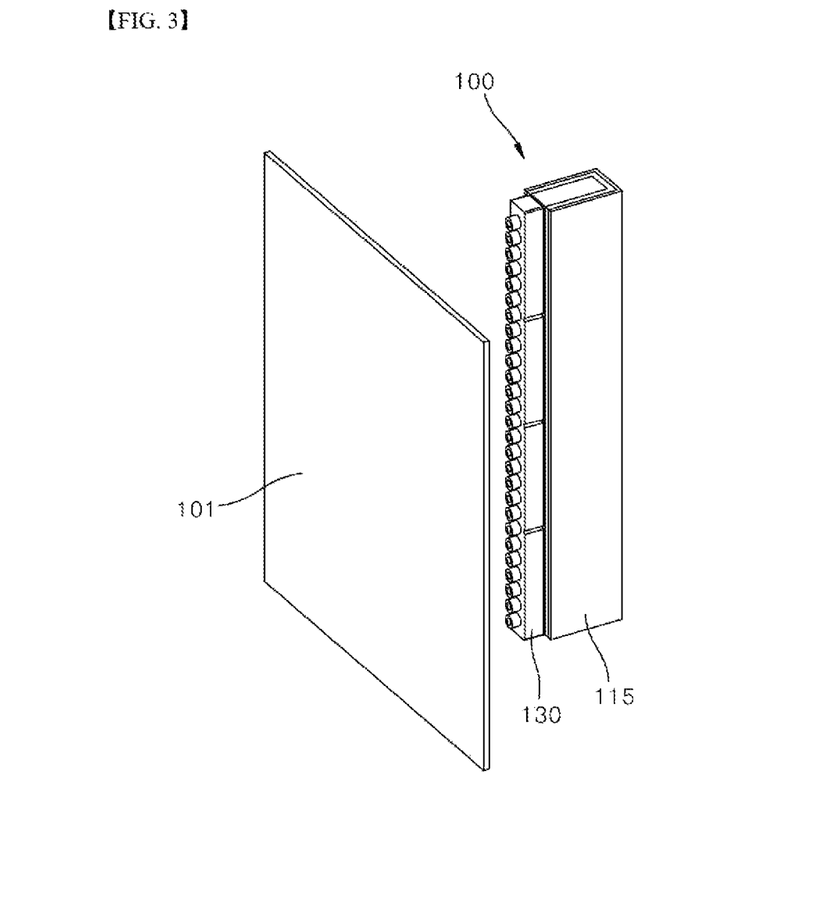
FIG. 3 shows a state in which a substrate and a source assembly face away each other.
Figure 4:
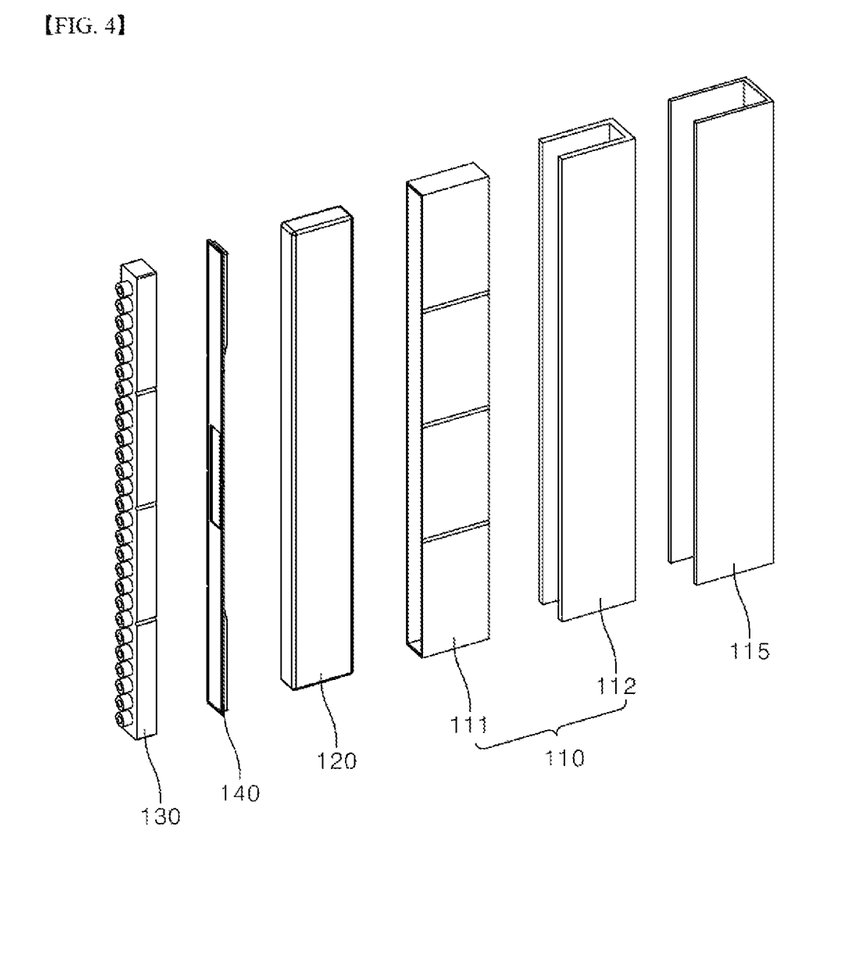
FIG. 4 is an exploded perspective view of a source assembly according to the present disclosure.
Figure 5:
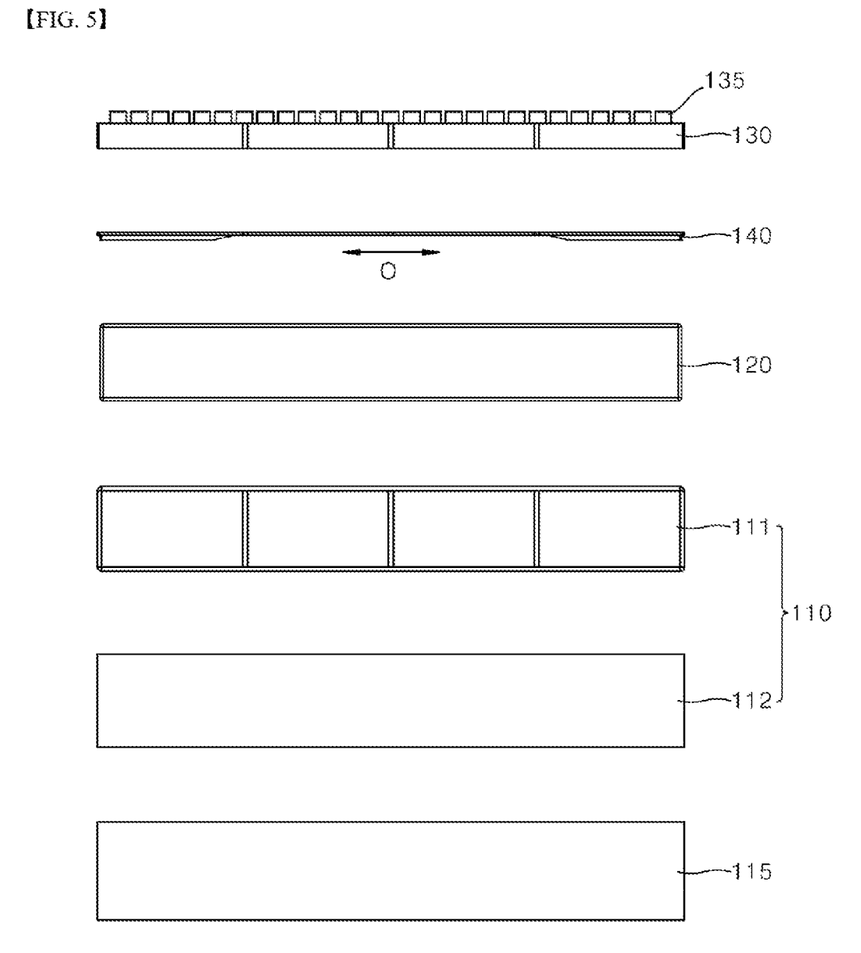
FIG. 5 is an exploded cross-sectional view of a source assembly according to the present disclosure.

FIG. 3 shows a state in which the substrate and the source assembly face away each other. FIG. 4 and FIG. 5 show an exploded perspective view and an exploded cross-sectional view of the source assembly respectively.

Referring to FIG. 3, the source assembly 100 is disposed to face away the substrate 101.

Referring to FIG. 3 to FIG. 5, the source assembly 100 includes the heating chamber 110, the source block 120, and the nozzle 130.

In this connection, the source block 120 has been molded into a selected shape. Since the source block 120 formed in the selected shape may directly face away the substrate, a conduit for transferring the vaporized source to the nozzle 130 may be omitted. The type of the source block may vary. For example, the selected shape may be a rectangular block, a parallelepiped block, or a rectangular parallelepiped block. Other various selected shapes may be contemplated. The source block formed into the selected shape may include a crystallized source block or a compression-molded source block.

Figure 6:
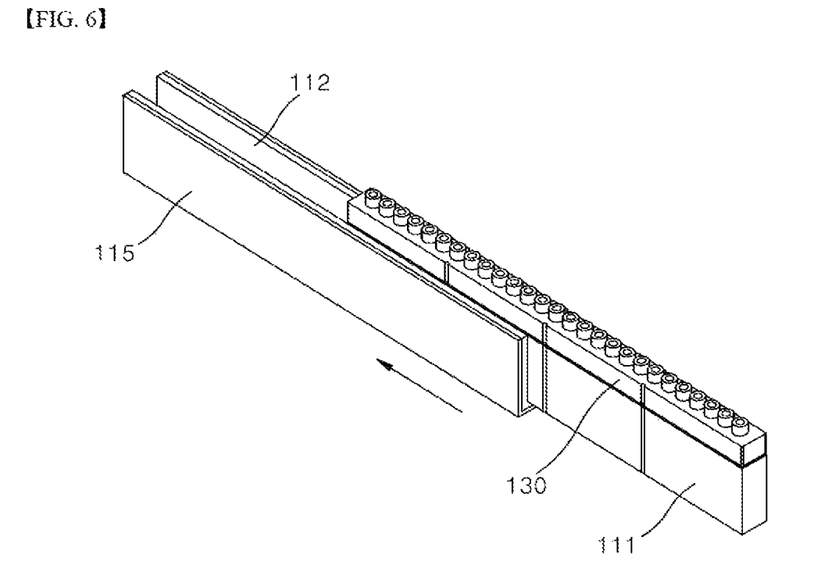
FIG. 6 shows an example in which a source assembly is assembled according to the present disclosure.

The heating means including a heater, a heating chamber 110 receives the source block 120 therein and serves to vaporize the source block by heating the source block. FIG. 4 and FIG. 5 show an example in which the heater or the heating chamber 110 is composed of a crucible 111 and a heating source 112 and has a two-component structure. However, the present disclosure is not limited thereto. For example, in other embodiments, the heating chamber 110 may have a single component structure. The source block 120 is indirectly heated and vaporized by the heating chamber 110. The heating chamber 110 may employ a resistance heating scheme, an induction heating scheme or the like. Any other suitable thermal source devices for heating the source block 120 may be utilized. As shown in FIG. 4, the heating chamber 110 includes side surfaces and a bottom surface. The bottom surface connects each side surfaces. The source block 120 may be received in a space defined by the two side surfaces and the bottom surface of the heating chamber 110. In one example, the source block 120 may be inserted into the space downwardly. Alternatively, the source block 120 may be inserted into the space laterally as shown in FIG. 6.

In one or more embodiments, the heater has an internal chamber of a selected shape. The source block 120 is positioned within the internal chamber of the heater. The source block 120 has a selected shape that may correspond to the shape of the internal chamber of the heater. For example, the shape of the internal chamber of the heater may have a selected shape, such as a rectangular parallelepiped block to fit the source block 120 having a corresponding shape.

In one or more embodiments, the heater may include a heating source or a thermal energy generating source such as an electrically powered heating coil. However, other suitable heating means and methods may be employed.

The nozzle 130 serves to discharge the source vaporized by the heating chamber 110. The nozzle 130 may be coupled to top portions of the side surfaces of the heating chamber 110. For example, the nozzle 130 may be mounted on each ends of the side surface and coupled at the end of the side surfaces. In another example, the nozzle 130 may be partially inserted into the C-shaped space defined by the two side surfaces and the bottom surface of the heating chamber 110 and coupled to the inner wall of the side surface of the heating chamber 110. Other suitable connection can be used at other locations of the heating chamber 110 for attaching the nozzle 130.

A combination of the nozzle 130 and the heating chamber 110 may adopt various container-cap coupling structures. The nozzle 130 may include a plurality of ejection holes 135.

In one example, referring to FIG. 4 and FIG. 5, at least one plate 140 may be further disposed between the source block 120 and the nozzle 130. The at least one plate 140 ensures that the source block and nozzle are slightly spaced apart from each other. Further, the at least one plate 140 has an opening O defined therein. Thus, a supplied amount of the vaporized source may be adjusted based on a size of the opening O. For example, the plate 140 may be embodied as a vapor pressure control membrane. The vapor pressure control membrane adjusts a size of a central opening so that an entire organic material can be vaporized in a high vacuum environment, while maintaining a constant spacing between the source block 120 and the nozzle 130.

Further, referring to FIG. 3 to FIG. 5, a cooling plate or a heat insulating plate 115 may be coupled to side surfaces and bottom surface of the heating chamber 110. The array of source assemblies is placed in one chamber. When evaporation temperatures of source blocks contained in the source assemblies are different from each other, it is necessary to reduce or minimize mutual heat influences between the source blocks (e.g., adjacent source blocks). In a case where the cooling plate or the thermal-insulating plate 115 is coupled to the outer side surfaces and bottom surface of the heating chamber 110 of each source assembly, this may inhibit unwanted transfer of heat from the source assembly to an adjacent source assembly. The cooling plate or thermal-insulating plate 115 may have side plates and a bottom plate as in heating chamber. In some embodiments, the cooling plate or thermal-insulating plate 115 may have similar shape as the heating chamber 110. For example, the cooling plate or thermal-insulating plate 115 may have a shape to cover the outer surface of the heating chamber 110. The heating chamber 110 may be inserted into a space defined by side plates and the bottom plate of the cooling plate or of the thermal-insulating plate 115. For example, when the cooling plate 115 is used, a pipe through which cooling water flows may be included inside the cooling plate 115.

FIG. 6 shows an example in which the source assembly is assembled according to the present disclosure. In the example shown in FIG. 6, the heating source 112 having both spaced sides and a bottom may be inserted into a space defined by both spaced sides and a bottom of the cooling plate or the thermal-insulating plate 115. In one example, the source block 120 is inserted inside the crucible 111. The nozzle 130 is coupled to a top of the crucible 111. The combination of the crucible 111 and the nozzle 130 may be coupled to the heating source 112 in a slidable manner.

Figure 7:
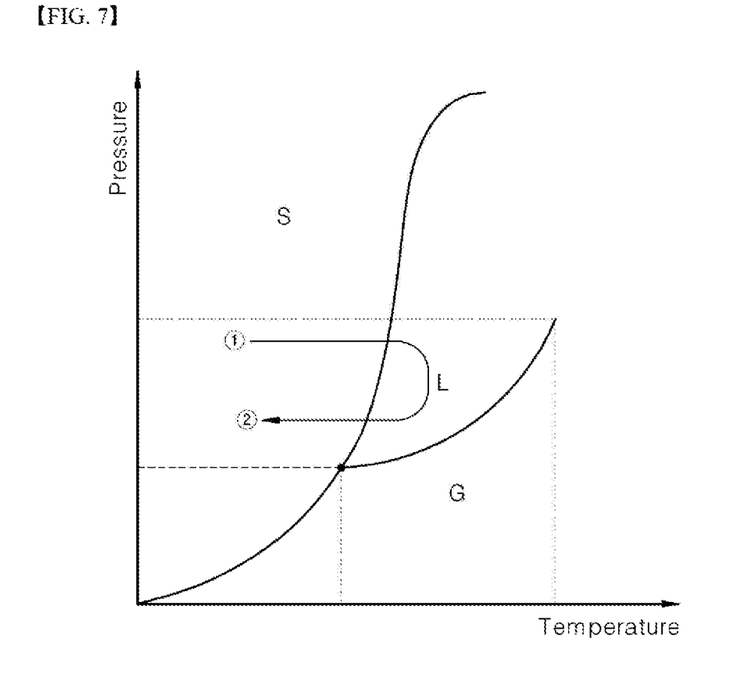
FIG. 7 shows a state diagram by which a source block according to the present disclosure is manufactured.
Figure 8:
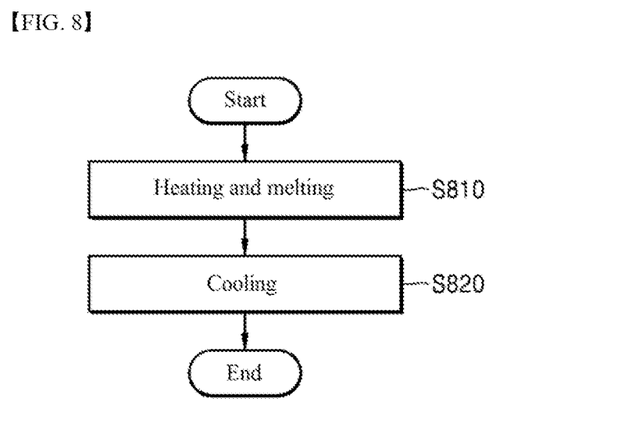
FIG. 8 shows a method for manufacturing a source block according to the present disclosure.

FIG. 7 shows a state diagram by which the source block, more specifically, the crystallized source block according to the present disclosure is produced. FIG. 8 shows a method for producing the source block according to the present disclosure.

As shown in FIG. 7 and FIG. 8, the crystallized source block may be produced by heating powders and melting the powders from a solid phase (S) to a liquid phase (L) (S810), and by cooling or crystallizing the liquid phase product to convert from the liquid phase (L) back to the solid phase (S) (S820). This process is similar to a glass production process.

The crystallized source block as produced in this way may be produced by melting and cooling the powder type source material. The characteristic of the crystallized source block is that it may exhibit a visible light transmittance greater than or equal to about 10%. However, the compression-molded source block contains a lot of pores therein because the compression-molded source block is produced by compacting the powders. Thus, the visible light transmittance of the compression-molded source block is smaller than about 10%. Therefore, the crystallized source block and compression-molded source block has distinct differences from each other. Further, the crystallized source block contains few or no pores, such that it has a higher density than that of the compression-molded source block and thus exhibits a high fracture strength. Thus, the crystallized source block has excellent shape retention ability in the lateral-type deposition process.

In one example, when forming a layer of a mixture of an organic material as a host and an organic material as a dopant, such as a light emitting layer of the electroluminescence device, the source block may be produced by melting a mixture of the organic material as the host and the organic material as the dopant and then cooling/crystallizing the melt mixture. In order for the mixture to be evenly deposited on the substrate, a distance between the source assembly and the substrate should be sufficiently large. However, the spacing between the source assembly and the substrate must be small to improve the deposition efficiency. In this connection, when the organic material as the host and the organic material as the dopant are mixed and melted and then cooled/crystallized, the organic materials are pre-mixed with each other. For this reason, the mixture may be deposited at a sufficiently high uniformity even when the spacing between the substrate and the source assembly is small.

EXAMPLE

A configuration and operation of the present disclosure shall be described in more detail below using one Example of the present disclosure. However, this Example is presented merely as one example of the present disclosure and cannot be construed as limiting the present disclosure in any way. Those skilled in the art will be able to technically deduce contents as not described herein, so that the description thereof will be omitted.

1. Source Block Production (1) Powders of a hole injecting layer (HIL) material, a hole transport layer (HTL) material, a red light-emitting layer material, a green light emitting layer material, a blue light-emitting layer material, an electron transport layer (ETL) material, and an electron injection layer material (EIL) material were respectively provided.

(2) The powders were subjected to a compression molding process using a press to produce a compression-molded source block. Alternatively, the powders were subjected to melting and cooling/crystallization to produce a crystallized source block.

2. Source Block Characteristic Evaluation

Figure 9:
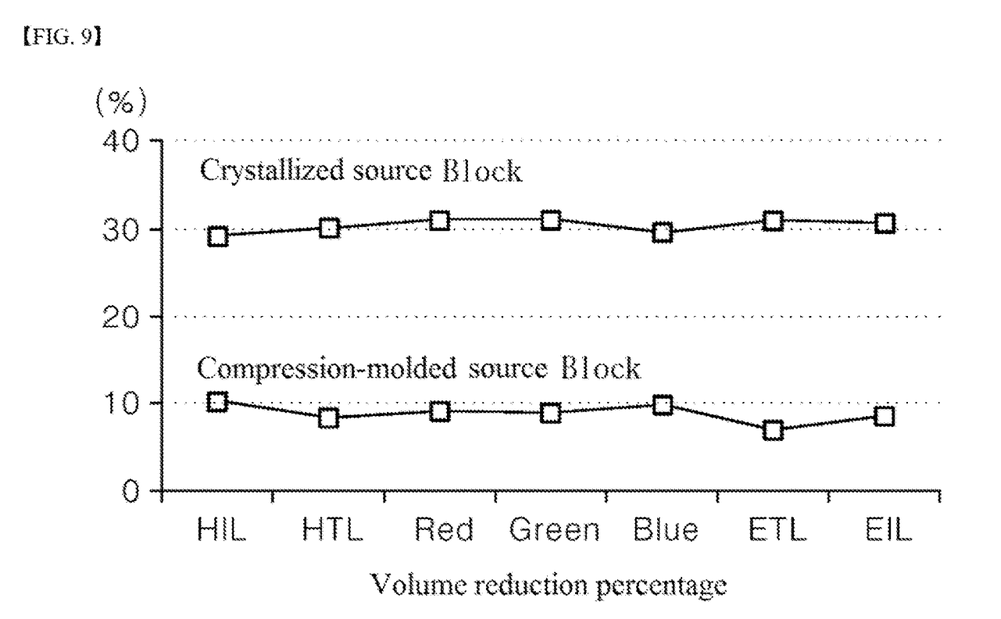
FIG. 9 shows a volume reduction percentage of each of a crystallized source block and a compression-molded source block.
Figure 10:
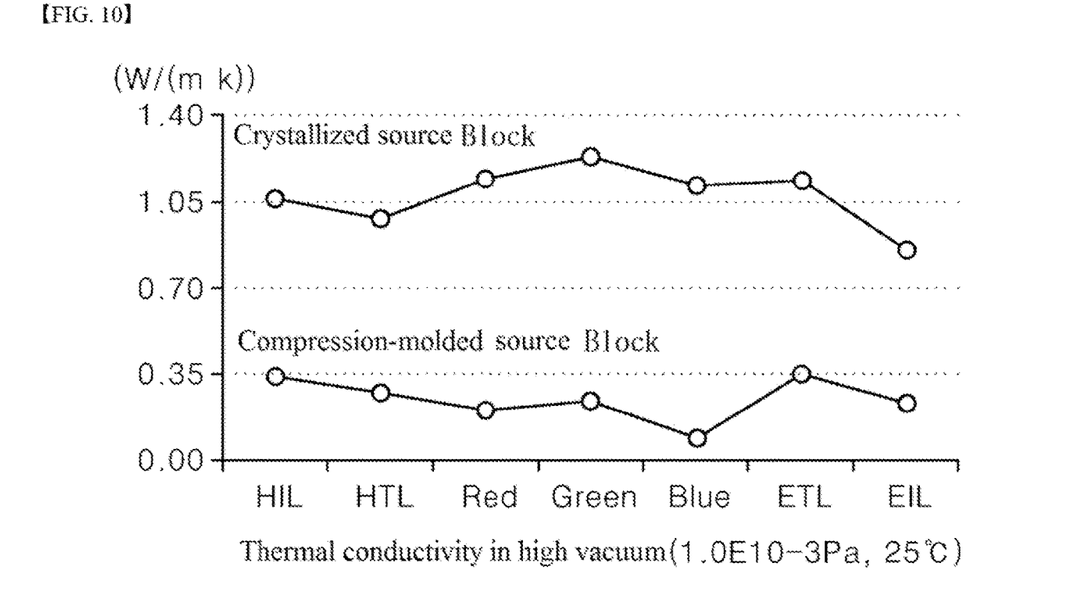
FIG. 10 shows a thermal conductivity of each of a crystallized source block and a compression-molded source block in a high vacuum state.
Figure 11:
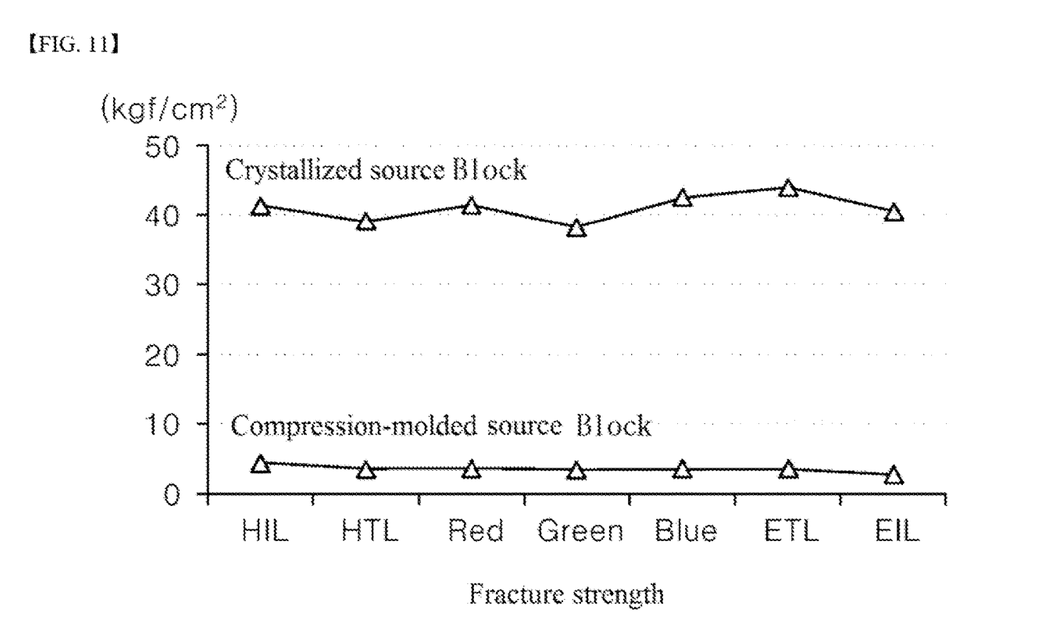
FIG. 11 shows a fracture strength of each of a crystallized source block and a compression-molded source block.

Volume reduction percentage, thermal conductivity, and fracture strength of the compression-molded and crystallized source blocks were measured. The measurements are shown in FIG. 9 to FIG. 11, respectively.

Each volume reduction percentage was obtained by measuring a volume (that is, a reference volume) of a powder state source material before a compression molding, a volume of a compression-molded source block after the compression molding, and a volume of a crystallized source block produced by melting, cooling/crystallizing the powder state source material and then by applying the measurements to a following equation:

Volume reduction percentage=(reference volume−volume of source block)/volume of source block×100

The thermal conductivity was measured for each of the compression-molded and crystallized source blocks at a temperature of about 25° C. and a vacuum state of about $1 \times 10^{-3}$ Pa.

The fracture strength was measured using a drop impact tester LT-LP1000.

FIG. 9 shows the volume reduction percentage of each of the crystallized source block and the compression-molded source block.

Referring to FIG. 9, the crystallized source block has the volume reduction percentage relatively large compared to that of the compression-molded source block. The large volume reduction percentage means that relatively few pores are included in the source block.

This large volume reduction percentage has the effect of increasing the filling efficiency of the deposited material. As a result, this may provide additional effects such as increasing a time for which a deposition is available and reducing the volume of the source assembly.

FIG. 10 shows the thermal conductivity of each of the crystallized source block and the compression-molded source block at a high vacuum state.

Referring to FIG. 10, the crystallized source block has the thermal conductivity higher in the high vacuum than that of the compression-molded source block. This difference in thermal conductivity therebetween depends on a difference in porosity therebetween.

FIG. 11 shows the fracture strength of each of the crystallized source block and the compression-molded source block.

Referring to FIG. 11, the crystallized source block has a relatively higher fracture strength than that of the compression-molded source block. The relatively higher fracture strength of the crystallized source block is obtained due to a compact microstructure resulting from the melting and cooling/crystallization.

Therefore, the crystallized source block having the high fracture strength may exhibit high shape-maintenance ability in the lateral-type deposition process. This may contribute to increased deposition stability.

Figure 12:
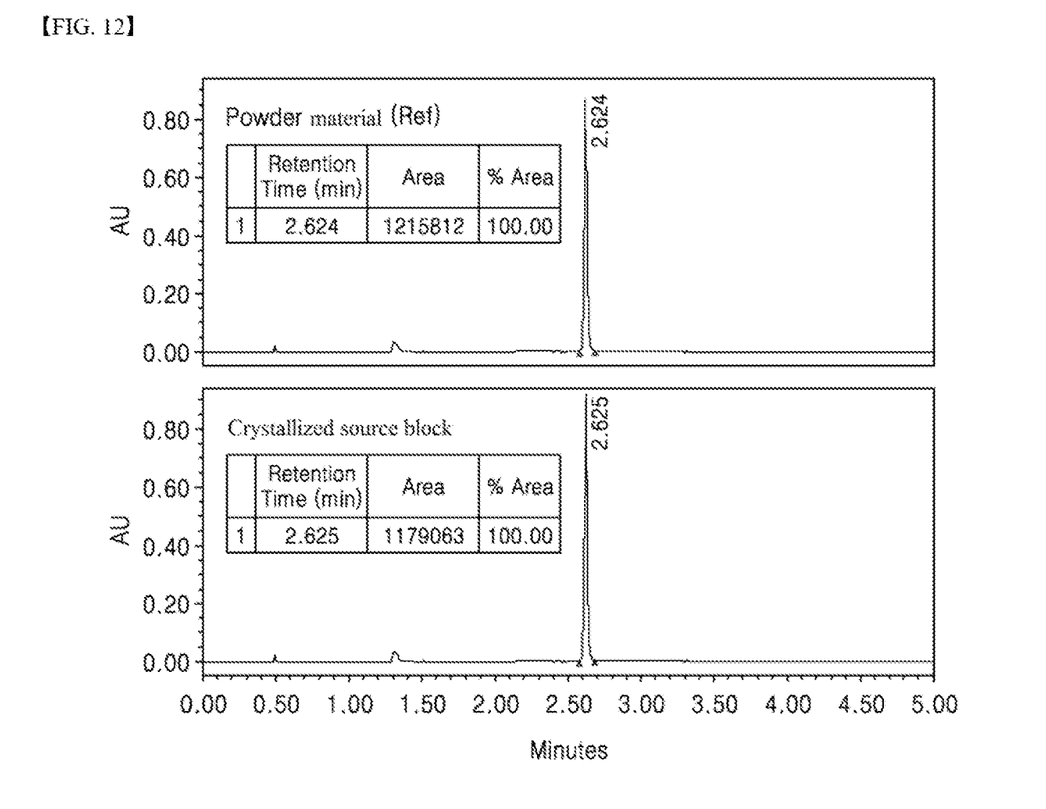
FIG. 12 shows a purity of a crystallized source block.

FIG. 12 shows a purity of a source in each of the powder state and the crystallized state for the same organic material.

Referring to FIG. 12, it may be seen that both the powder state and the crystallized state exhibit the same peak. Therefore, it may be seen that even when the powder is melted and cooled/crystallized to manufacture the source block, this process does not result in the purity change.

A following Table 1 shows a maximum transmittance of each of the compression-molded and crystallized source block in about 190 nm to 900 nm region.

TABLE 1

| Max transmittance | HIL | HTL | Red | Green | Blue | ETL |
|---|---|---|---|---|---|---|
| Compression-molded source block | 0.05 | 0.08 | 0.05 | 0.05 | 0.05 | 0.05 |
| Crystallized source block | 32.38 | 41.94 | 39.50 | 31.99 | 36.36 | 37.58 |

Referring to Table 1, the compression-molded source block has a very low visible light transmittance smaller than about 1%. To the contrary, the crystallized source block has the visible light transmittance over about 30% for all organic materials for layers of the electroluminescence device. This means that the compression-molded source block and the crystallized source block having the same shape exhibit completely different characteristics.

As shown in the above examples, although the compression-molded source block is used for a lateral-type vacuum deposition apparatus according to the present disclosure, in some embodiments, it is more preferable to use the crystallized source block in terms of the density, strength, and the like.

The source block for the lateral-type vacuum deposition apparatus according to the present disclosure may be a molded block having a predetermined shape. Thus, in the lateral-type vacuum deposition apparatus, the substrate and the source block may face away each other. Accordingly, the lateral-type vacuum deposition apparatus including the source block according to the present disclosure may be free of a conduit for transferring a vaporized source to the nozzle, thereby simplifying the structure of the apparatus. In particular, the source block for the lateral-type vacuum deposition apparatus according to the present disclosure may exhibit excellent shape maintenance ability during a lateral-type vacuum deposition process, while having a visible light transmittance of about 10% or greater.

The present disclosure as described above is not limited to the above-described embodiments and the accompanying drawings. It will be obvious to those skilled in the art that various substitutions, modifications and variations are possible without departing from the technical disclosure of the present disclosure. Therefore, the scope of the present disclosure is to be defined by the appended claims. It is intended that all changes and modifications that come within the meaning and range of equivalency of the claims and the equivalents thereof be included within the scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A source assembly for a lateral-type vacuum deposition apparatus, the source assembly comprising:
a heating chamber including a heating source and a crucible, the heating chamber having an internal chamber of a selected shape, the internal chamber of the selected shape extending in a longitudinal direction, the internal chamber of the selected shape being an interior of the crucible, the internal chamber of the heating chamber configured to house within it a source block having a selected shape that corresponds to the shape of the internal chamber of the heating chamber;
a nozzle coupled to the heating chamber, the nozzle configured to exhaust the source block vaporized by the heating chamber and has a plurality of ejection holes;
at least one plate placed between the crucible and the nozzle, wherein the plate has an opening defined therethrough, the opening configured to be adjustable in size; and
a cooling plate coupled to an outer surface of the heating chamber,
wherein the source block is a crystallized source block,
wherein the plate has a bottom surface that is flush with a top surface of the crucible,
wherein the nozzle protrudes beyond the top of the cooling plate, and
wherein the crucible and the nozzle have a plurality of sections and each section has two or more of the plurality of ejection holes.

2. The source assembly of claim 1, wherein the source block has a visible light transmittance greater than or equal to about 10%.

3. The source assembly of claim 1, wherein the source block is made of an organic material of a layer of an electroluminescence device.

4. The source assembly of claim 1, wherein the selected shape includes a rectangular parallelepiped shape.

5. A source assembly for a lateral-type vacuum deposition apparatus, the source assembly comprising:
a heating chamber for heating and vaporizing a source block having a selected shape, the heating chamber including a crucible and a heating source, the crucible of the heating chamber configured to house the source block;
a nozzle on the heating chamber for exhausting a source of the source block vaporized by the heating chamber, wherein the nozzle has a plurality of ejection holes;
at least one plate placed between the crucible and the nozzle, wherein the plate has an opening defined therethrough, the opening configured to be adjustable in size; and
a cooling plate coupled to an outer surface of the heating chamber,
wherein the source block is a crystallized source block,
wherein the plate has a bottom surface that is flush with a top surface of the heating chamber,
wherein the nozzle protrudes beyond the top of the cooling plate, and
wherein the crucible and the nozzle have a plurality of sections and each section has two or more of the plurality of ejection holes.

6. The source assembly of claim 5, wherein the source block includes a source material for forming at least one of an electron transport layer, a light emission layer, a hole transport layer of the electroluminescence device.

7. The source assembly of claim 5, wherein the crucible of the heating chamber has both spaced side walls and a bottom coupled to the walls, wherein the source block is inserted into a space defined by the side walls and the bottom.

8. The source assembly of claim 7, wherein the nozzle is coupled to a top portion of each of the side walls of the crucible of the heating chamber.

9. The source assembly of claim 5, wherein the selected shape includes a rectangular parallelepiped shape.

10. A lateral-type vacuum deposition apparatus comprising:
a vacuum chamber for accommodating therein a substrate, wherein the substrate is disposed in one lateral end of the vacuum chamber and in a vertical orientation; and
a source assembly disposed in an opposite lateral end to the one lateral end of the vacuum chamber and in the vertical orientation, the source assembly including:
a heating chamber, the heating chamber including a crucible configured to house a source block having a selected shape and a heating source configured to heat and vaporize the source block;

at least one plate placed on the crucible;

a nozzle for supplying a source from the source block vaporized by the heating chamber toward the substrate, wherein the nozzle is coupled to a top portion of each of the side walls of the heating chamber and has a plurality of ejection holes; and a cooling plate coupled to an outer surface of the heating chamber, wherein the source assembly is configured for supplying a vaporized source to the substrate, wherein the source block is a crystallized source block, wherein the crucible has a first side wall and a second side wall spaced apart from each other and a bottom coupled to both the first side wall and the second side wall, wherein the plate has a bottom surface that is flush with a top surface of the first side wall and a top surface of the second side wall, wherein the heating source has a third side wall facing the first side wall of the crucible and the fourth side wall facing the second side wall of the crucible and is open in a longitudinal direction, and wherein, during operation, the crucible is slidably inserted into the heating source in the longitudinal direction and the first side wall of the crucible contacts the third side wall of the heating source and the second side wall of the crucible contacts the fourth side wall of the heating source, wherein the nozzle protrudes beyond the top of the cooling plate, and wherein the crucible and the nozzle have a plurality of sections and each section has two or more of the plurality of ejection holes.

11. The lateral-type vacuum deposition apparatus of claim 10, wherein the source block has a visible light transmittance greater than or equal to about 10%.

12. The lateral-type vacuum deposition apparatus of claim 10, wherein, during operation, the source block is inserted into a space defined by the side walls and the bottom of the crucible.

13. The lateral-type vacuum deposition apparatus of claim 10, wherein the plate placed between the crucible and the nozzle, wherein the plate has an opening defined therethrough.

14. The lateral-type vacuum deposition apparatus of claim 10, wherein the source assembly includes a plurality of source assemblies arranged in a first direction and disposed in the opposite lateral end of the vacuum chamber, wherein the substrate is transported in the first direction in the vacuum chamber.

15. The lateral-type vacuum deposition apparatus of claim 10, wherein the selected shape includes a rectangular parallelepiped shape.

16. The source assembly of claim 1, wherein the crystallized source block is produced by melting a powder state source material to a liquid and then cooling the liquid to convert it to crystallized material.

17. The source assembly of claim 5, wherein the crystallized source block is produced by melting a powder state source material to a liquid and then cooling the liquid to convert it to crystallized material.

18. The lateral-type vacuum deposition apparatus of claim 10, wherein the crystallized source block is produced by melting a powder state source material to a liquid and then cooling the liquid to convert it to crystallized material.

19. The source assembly of claim 1, wherein the cooling plate has a pair of side walls facing side walls of the crucible and extending in a longitudinal direction and is open in the longitudinal direction.

20. The source assembly of claim 19, wherein cooling of the crucible is made by the pair of side walls of the cooling plate.

21. The source assembly of claim 19, wherein a pipe through which cooling water flows includes inside the cooling plate.

22. The lateral-type vacuum deposition apparatus of claim 10, wherein the cooling plate has a pair of side walls facing the first and second side walls of the crucible and extending in a longitudinal direction and is open in the longitudinal direction.

23. The lateral-type vacuum deposition apparatus of claim 22, wherein cooling of the crucible is made by the pair of side walls of the cooling plate.

24. The lateral-type vacuum deposition apparatus of claim 22, wherein a pipe through which cooling water flows includes inside the cooling plate.

* * * * *